May 2, 1950 E. E. COMBS 2,505,754
SUPERHETERODYNE CIRCUIT
Filed Aug. 2, 1945
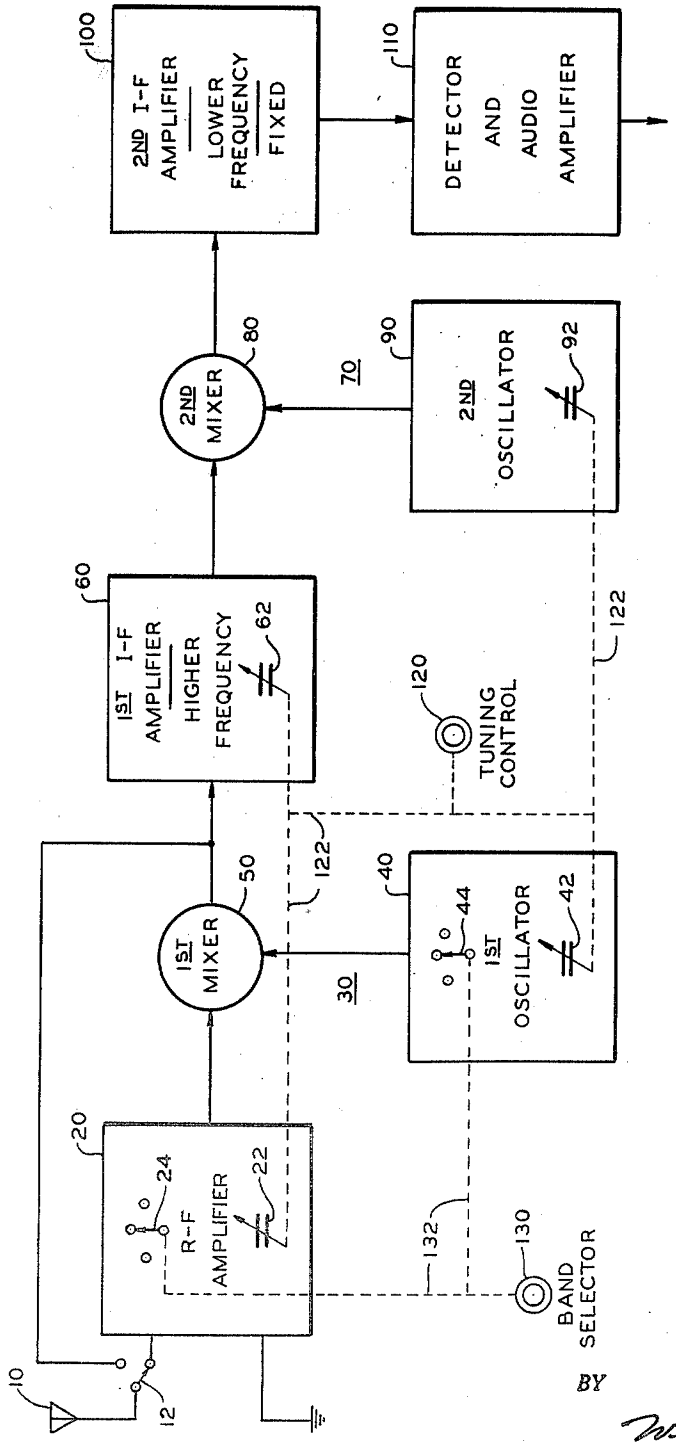
INVENTOR.
EDWARD E. COMBS
BY
William D. Hall.
ATTORNEY Patented May 2, 1950

2,505,754

UNITED STATES PATENT OFFICE 2,505,754

SUPERHETERODYNE CIRCUIT

Edward E. Combs, Long Branch, N. J.

Application August 2, 1945, Serial No. 608,570

4 Claims. (Cl. 250—20)

(Granted under the act of March 3, 1883, as amended April 30, 1928; 370 O. G. 757)

The invention described herein may be manufactured and used by or for the Government for governmental purposes, without the payment to me of any royalty thereon.

My invention relates to a novel superheterodyne receiver which provides a number of advantages over circuits of conventional design.

The major aspects of a radio receiver that determine its qualities are selectivity, sensitivity, and frequency range. There are other attributes of a receiver which are desirable, but these are dependent to a large extent upon the established limits of the three listed qualities. For instance, the fidelity of reception of an amplitude modulated signal is within limits dependent upon the selectivity of the receiver, high selectivity reducing the response to high modulating frequencies.

The superheterodyne circuit of today provides to a large degree a measure of control over the three listed qualities, the limits of which are established by the designer. With the superheterodyne circuit, the selection of the intermediate frequency is a compromise based on desired selectivity, image rejection ratio, and gain, in view of the requirements for signal frequency range.

A good receiver must have adequate and controlled selectivity, and this property can be obtained quite simply for a given frequency by using a fixed-tuned radio frequency amplifier. However, in order to obtain flexible tuning and still retain the advantages of the controlled and uniform selectivity of the fixed tuned amplifier, superheterodyne action must be used. Thus, a given signal is received in a tunable circuit tuned to its particular frequency, mixed with the output of a local oscillator in an appropriate circuit to obtain a resultant mixture of frequencies, one of which is the desired intermediate frequency signal. The local oscillator is so arranged that its frequency differs from the received signal, either greater or less than, by an amount equal to the intermediate frequency. To maintain this frequency difference constant over the entire frequency range of the receiver, the local oscillator is usually gang-tuned with the mixer input and some means for tracking the oscillator frequency with the incoming signal frequency is used. In the superheterodyne circuit using variable capacitor tuning, use is made of a series tracking capacitor inserted in series with the tuning capacitor section of the oscillator when the oscillator frequency is higher than the received signal, or in series with the mixer tuning capacitor when the oscillator frequency is lower than the received signal.

It becomes obvious when the action of the superheterodyne circuit is examined that, when the ratio of intermediate frequency to signal frequency becomes as low as 2% of the received signal, the tuned input circuit of the mixer cannot easily discriminate between the signal frequency and its image frequency. This problem of frequency discrimination or image selectivity can be considerably reduced by the use of a tuned radio frequency amplifier ahead of the mixer stage. However, even this expedient fails to do much good when the ratio of intermediate frequency to received frequency becomes as small as 1%. Thus, with these facts in mind, it can be practically stated that the upper frequency limit of a superheterodyne circuit for good image rejection is approximately 20 to 25 times the intermediate frequency when using one stage of preselection or radio frequency amplification ahead of the mixer. In the case where an intermediate frequency of 450 kc. is used, the upper frequency limit is approximately 10,000 kc. for an image rejection ratio of 100 to 1 or better, considering the "Q" of the usual associated circuits.

It was pointed out above that proper gang tuning requires a series tracking capacitor. A mathematical solution of the tracking problem involves a cubic equation for the tuned circuit containing the series tracking capacitor. From this equation it can be shown that the net result is that the two ganged circuits will track exactly at three frequencies only, within any particular frequency band being examined. Thus, if the receiver is to have a number of bands in order to cover a wide frequency range, it is obvious that the circuits can be made to track at only three frequencies in each band. Even to obtain this result, a different series tracking capacity must be used in each band.

In considering the case of a superheterodyne receiver that is to cover only a single band of frequencies, it is well known that, by judicious plate bending of the oscillator capacitor or by proper selection of plate shapes, the oscillator and mixer stages can be made to track exactly throughout the entire frequency range. If this is done, additional mixer input circuit selectivity may be used without causing variations in selectivity usually caused by mistracking of the ganged circuits. But this expedient cannot be used to obtain exact tracking in all bands of a multiband receiver unless a different tuning capacitor is used for each band.

Quite often, the fact that it is the I.-F. amplifier that provides the selectivity is overlooked, especially in the case where two preselector stages are used in front of the mixer stage. If it is assumed that the I.-F. amplifier has a band pass of 15 kc., at 10 times down, and the two stages of preselection give an image rejection ratio of ten to one at 45 mc., then the selectivity of the tuned R.-F. preselector stages is such that it has a band pass of twice the intermediate frequency, or 900 kc. at ten times down. From this comparison, it is quite obvious that, within practical limits, the overall receiver selectivity is improved as the intermediate frequency is lowered, while, on the other hand, the image rejection ratio is improved as the intermediate frequency is raised. Thus, for any given coverage of the radio frequency spectrum, a compromise must be made as to the exact intermediate frequency to be used.

In the usual superheterodyne circuit, the I.-F. circuits are not tunable. Detailed examination of conventional superheterodyne action will show that operation of the signal input circuits at or very near to the intermediate frequency will yield spurious responses. If the signal input circuit were tuned to 455 kc. with a 450 kc. I.-F. amplifier, sum and difference frequencies would be impressed upon the input of said I.-F. amplifier, said difference frequency producing an undesirable 5 kc. beat in the second detector.

The advantages of good selectivity provided by a low intermediate frequency amplifier are sometimes combined with the advantages of good image rejection of a relatively high intermediate frequency amplifier by using the double superheterodyne circuit. In this case, the first I.-F. amplifier might be fixedly tuned to 4.5 mc. and the second I.-F. amplifier tuned to a frequency of 450 kc. The heterodyning of the output of the first mixer stage with a second fixed local oscillator produces the second I.-F. output. This arrangement, however, has the disadvantage that signal input circuits cannot be tuned to a frequency lower than the highest I.-F., in this case 4.5 mc.

From the discussion given, it becomes apparent that with conventional circuits, it is impractical to design a superheterodyne receiver that covers too large a portion of the frequency spectrum, because the lowest frequency is determined by the intermediate frequency, while the highest frequency is determined by the image rejection ratio which is, in turn, a function of the intermediate frequency selected. Thus, for ordinary purposes, the ratio of the highest frequency to the lowest frequency that can be used to advantage in the signal input circuit is about thirty to one for continuous frequency coverage.

It is a principal object of my invention to provide a novel multiband receiver of the superheterodyne type which reduces tracking problems; hence, band-changing problems.

It is a further object of my invention to provide a novel superheterodyne receiver having both good selectivity and good image rejection.

Another object of my invention is to provide a novel superheterodyne receiver having a constant image rejection ratio in any given band.

Yet another object of my invention is to provide a novel receiver of the double superheterodyne type having extended frequency range with a minimum of band switching.

In accordance with my invention, use is made of two tunable frequency changers in cascade to provide two intermediate frequencies, the first higher than the second, whereby good image rejection is provided by the first intermediate frequency, and good selectivity is provided by the second intermediate frequency.

The first frequency changer comprises a tunable oscillator and a mixer having a tunable input circuit, which may incorporate one or more stages of radio frequency amplification tunable over a desired frequency range. Both the oscillator and the input circuit of the mixer are provided with band-changing means. Contrary to the conventional usage in which the intermediate frequency amplifier is fixedly tuned, the first intermediate frequency amplifier is made tunable over a fixed band. The tuning range of said mixer input circuit, said oscillator, and said first I.-F. amplifier is such that, for any given band, the ratio of the frequency to which the mixer input circuit is tuned, with respect to the frequency of the oscillator is maintained constant. Because of this constant ratio, no series tracking capacitor or other means need be provided in any of these tuned circuits to make the circuits track, since under this condition the circuits are self-tracking.

The second frequency changer is coupled to the output of the first I.-F. amplifier. Its operation is conventional in that its oscillator is tunable over such a range as to provide a second intermediate frequency which is constant and lower than any frequency provided by the tunable I.-F. amplifier. This constant I.-F. is, in turn, amplified by a second I.-F. amplifier, which is fixedly tuned. Because of said constant frequency difference, the oscillator of the second frequency changer must be provided with the usual tracking means; but, because this oscillator is tunable over a fixed frequency range regardless of which band the receiver is operating in, the tracking problem is relatively simple. The output of the second I.-F. amplifier is then detected in the usual manner.

For a better understanding of the invention, together with other and further objects thereof, reference is had to the following description taken in connection with the accompanying drawing, which shows a block diagram of my invention.

The drawing show a double superheterodyne receiver incorporating a tuned circuit 20, which may include one or more stages of radio frequency amplification, connected between an antenna 10 and a first frequency changer 30, comprising a tunable local oscillator 40 and a mixer 50. The output of mixer 50 preferably provides a variable, relatively high, intermediate frequency to provide good image rejection. This output is amplified by a first I.-F. amplifier 60, which is tunable over a fixed frequency band, and then applied to a second frequency changer 70, comprising a second mixer 80 and a second tunable oscillator 90. The frequency range of second oscillator 90 is such that the output of mixer 80 is a second intermediate frequency which is constant and is, preferably, relatively low to provide for good selectivity. The second intermediate frequency is then further amplified by a fixedly-tuned second I.-F. amplifier 100 having any desired degree of selectivity as in conventional receivers. The output of amplifier 100 is then applied to the detector and audio amplifier 110.

Components 20, 40, 60 and 90, are provided with continuous tuning means, exemplified by variable condensers 22, 42, 62 and 92, respectively, preferably unicontrolled by a single tuning control element 120, as indicated by broken line 122. Components 20 and 40 are also provided with band selecting means, exemplified by switches 24 and 44, respectively, both preferably unicontrolled by a single band-selector control element 130, as indicated by broken line 132. A switch 12 is also provided to selectively connect the antenna to the input of R.-F. amplifier 20 or the input of first I.-F. amplifier 60 for purposes hereinafter explained.

The first frequency changer 30 does not provide a constant I.-F. output, as is the usual practice. Instead, the tuning range of the signal input circuit to mixer 50, with respect to the tuning range of oscillator 40 is made such that the ratios of maximum to minimum frequencies of both tuned circuits are equal regardless of the band they are operating in; and that, at any setting in a given band, the incoming signal frequency selected by circuit 20 bears a constant ratio to the frequency generated by oscillator 40, which may be accomplished by making the law of frequency variation of both tuned circuits similar. The resultant I.-F. output of mixer 50 is therefore variable and the first I.-F. amplifier 60 is always tuned to accept the output frequency of mixer 50. This can be attained, even with the unicontrol feature, without any tracking means in the tuned circuits of I.-F. amplifier 60, by making its tuning characteristic such that the ratio of its maximum to minimum frequencies is equal to that of the other tuned circuits in all wave bands, and that the ratio of any frequency to which it is tuned, with respect to any frequency to which the R.-F. amplifier 20 is tuned, is constant for any given wave band.

This feature also permits band-changing of R.-F. amplifier 20 and first oscillator 40 without the need for any tracking means. The tuning range of first I.-F. amplifier 60 can also be made fixed, regardless of the frequency band in which components 20 and 40 are operating.

Because the second I.-F. amplifier 100 is fixedly tuned, means must be provided to make the output frequency of oscillator 90 track with the output frequency of first I.-F. amplifier 60 to provide a constant frequency difference, but this feature is not objectionable because the tuning range of second oscillator 90 is fixed, regardless of the band in which the receiver is operating.

To further illustrate the operation of the above-described system, let it be assumed that the frequency range of first I.-F. amplifier 60 is 2 mc.–4 mc., a ration of 2 to 1, and the frequency to which the second I.-F. amplifier 100 is fixedly tuned is 450 kc. The tuning range of second local oscillator 90 will therefore be from 2.45 mc.–4.45 mc. The tuning range of the incoming signal frequency amplifier circuit 20 and the tuning range of oscillator 40 will also bear a 2 to 1 ratio, e. g., circuit 20 may tune from 4 mc.–8 mc., and the oscillator 40 from 6 mc.–12 mc., so that the outputs thereof will combine to yield difference frequencies of from 2 mc.–4 mc., to which first I.-F. amplifier 60 is tunable. In this manner the incoming signal frequency passed at any time by tuned R.-F. amplifier 20 will always bear a constant ratio with respect to the frequency of oscillator 40, for any given wave-band in which these two components are operating, thereby eliminating the need for any tracking expedients. Operation in the 2 mc.–4 mc. band can be accomplished by operating switch 12 to connect the antenna directly to the first I.-F. amplifier 60, thereby cutting out all the preceding components, and, in effect, providing standard superheterodyne action in this band. Or, the same end can be attained by tuning R.-F. amplifier 20 from 2 mc.–4 mc. and rendering the first local oscillator 40 inoperative. The number of separate bands to which the first local oscillator 40 is tunable can be further reduced by operating it above the incoming signal frequency in some wave-bands, and below the incoming signal frequency in other wave-bands.

Because the first I.-F. amplifier is gang-tuned with the other circuits, it is possible to so design the circuits that at no time will a harmonic of either local oscillator fall within the pass-band of the tuned signal circuits.

The novel circuit above-described possesses a number of other advantages. It makes possible a receiver having a ratio of maximum to minimum frequency as high as 100 to 1, or more, with continuous frequency coverage. In fact, a tuning range of 250 kc. to 80 mc., a ratio of 320 to 1, is possible.

By properly proportioning the tuning range of the first I.-F. amplifier 60 and the second oscillator 90, incoming signals having a frequency which is the same or near that of the second I.-F. amplifier 100 can be received, making it possible to tune the amplifier 20 to a frequency which is even lower than the second intermediate frequency, e. g., 250 kc. Good image rejection will be obtained for incoming signal frequencies which are two to twenty-five times that of the first intermediate frequency band, i. e., up to approximately 80 mc. Because the ratio of signal input frequency to first I.-F. amplifier frequency is a constant for any particular band, the image rejection ratio will also tend to be constant over a given band.

By utilizing the principles above-described, a single receiver can be built which has a limited number of wave-bands which can be installed as need indicates. Thus, a single mechanism will provide a number of receivers each covering a different portion of the radio frequency spectrum; for example, 250 kc.–8000 kc. in five bands for one model, 1 mc.–32 mc. for a second model, and 4 mc.–128 mc. for a third model.

The following is an example of a six-band receiver designed in accordance with my invention:

Frequency of second I.-F. amplifier 100 is 500 kc. Frequency range of first I.-F. amplifier 60 is 1.50 mc.–3.25 mc. Frequency ratio of circuits 20, 40, and 60 is 2.15 to 1. Frequency range of second oscillator 90 is 2 mc.–2.75 mc. Desired frequency range of the receiver is 150 kc.–15 mc.

The tuned circuits of amplifier 20 have the following wave ranges:

Band 1—150 to 325 kc.
Band 2—325 to 700 kc.
Band 3—700 to 1500 kc.
Band 4—1.5 to 3.25 mc.
Band 5—3.25 to 7.00 mc.
Band 6—7.00 to 15.00 mc.

The tuned circuits of first oscillator 40 have the following ranges:

| | |
|---|---|
| Band 1—1.650 to 3.575 mc.<br>Band 2—1.825 to 3.950 mc.<br>Band 3—2.200 to 4.750 mc. | 1st oscillator frequency higher than signal frequency. |
| Band 4—Not used | 1st frequency changer disconnected. |
| Band 5—1.750 to 3.750 mc<br>Band 6—5.500 to 11.750 mc. | 1st oscillator frequency lower than signal frequency. |

This completes the description of my invention. It will be seen that the provision of a double superheterodyne with a tunable, first intermediate-frequency amplifier which is unicontrolled with the other circuits, and the provision, in all variably tuned circuits ahead of the second mixer, of a constant ratio of minimum to maximum frequency in all wave-bands provides the following desirable characteristics:

*a*. No tracking means is necessary for the circuits preceding the second mixer, thereby simplifying wave-band changing.

*b*. The same circuit tracking means in the second oscillator is sufficient for all wave-bands.

*c*. Only the tuned circuits preceding the first I.-F. amplifier require band switching.

*d*. A highly selective, low frequency, second I.-F. amplifier can be used in conjunction with received frequencies up to 100 mc. and still retain good image rejection characteristics.

*e*. Constant image rejection ratio in a given wave-band.

*f*. Greatly extended frequency range with a minimum of circuit interaction and band-switching.

While there has been described what is at present considered a preferred embodiment of the invention, it will be obvious to those skilled in the art that various changes and modifications may be made therein without departing from the invention, and it is aimed in the appended claims to cover all such changes and modifications as fall within the true spirit and scope of the invention.

I claim:

1. A multi-band superheterodyne receiver comprising a first mixer, a continuously tunable circuit coupled to the input of said mixer, a continuously tunable oscillator coupled to said mixer, a beat frequency amplifier coupled to the output of said mixer and continuously tunable over a fixed predetermined frequency range, a continuously tunable heterodyne frequency changer coupled to the output of said beat frequency amplifier to derive therefrom a second and fixed beat frequency from any signal in said fixed predetermined frequency range, a beat frequency amplifier coupled to the output of said frequency changer and tuned to said fixed beat frequency, and band change means to vary only the tuning range of said continuously tunable circuit and said continuously tunable oscillator, the ratios of the maximum to minimum frequencies of said continuously tunable circuit and said continuously tunable oscillator being constant in all wave bands.

2. A multi-band superheterodyne receiver comprising a first mixer, a continuously tunable circuit coupled to the input of said mixer, a continuously tunable oscillator coupled to said mixer, a first intermediate frequency amplifier coupled to the output of said mixer and continuously tunable over a fixed predetermined frequency range, a continuously tunable heterodyne frequency changer coupled to the output of said intermediate frequency amplifier to derive therefrom a second and fixed intermediate frequency, a second intermediate frequency amplifier coupled to the output of said frequency changer and tuned to said fixed intermediate frequency, and band change means to vary only the tuning range of said continuously tunable circuit and said continuously tunable oscillator, the ratios of the maximum to minimum frequencies of said continuously tunable circuit and said continuously tunable oscillator being constant in all wave bands.

3. A multi-band superheterodyne receiver comprising a first mixer, a continuously tunable circuit coupled to the input of said mixer, a continuously tunable oscillator coupled to said mixer, a first intermediate frequency amplifier coupled to the output of said mixer and continuously tunable over a fixed predetermined frequency range, a continuously tunable heterodyne frequency changer coupled to the output of said intermediate frequency amplifier to derive therefrom a lower fixed intermediate frequency, a second intermediate frequency amplifier coupled to the output of said frequency changer and tuned to said fixed intermediate frequency, and band change means to vary only the tuning range of said continuously tunable circuit and said continuously tunable oscillator, said continuously tunable circuit and said continuously tunable oscillator having the same law of frequency variation throughout all wave bands.

4. A multi-band superheterodyne receiver comprising a first mixer, a continuously tunable first circuit coupled to the input of said mixer, a continuously tunable oscillator coupled to said mixer, a second circuit responsive to the output of said mixer and continuously tunable over a fixed predetermined frequency range, a continuously tunable heterodyne frequency changer coupled to the output of said second circuit to derive therefrom a fixed beat frequency from any signal in said fixed predetermined frequency range, a beat frequency amplifier coupled to the output of said frequency changer and tuned to said fixed beat frequency, and band change means to vary only the tuning range of said first circuit and said continuously tunable oscillator, said continuously tunable first circuit and said continuously tunable oscillator having the same law of frequency variation throughout all wave bands.

EDWARD E. COMBS.

REFERENCES CITED

The following references are of record in the file of this patent:

UNITED STATES PATENTS

| Number | Name | Date |
|---|---|---|
| 1,763,751 | Bown | June 17, 1930 |
| 1,933,778 | West | Nov. 7, 1933 |
| 2,029,035 | Roberts | Jan. 28, 1936 |
| 2,031,130 | Rohnfeld | Feb. 18, 1936 |
| 2,032,675 | Waller | Mar. 3, 1936 |
| 2,141,756 | Linsell | Dec. 27, 1938 |
| 2,151,810 | Siemens | Mar. 28, 1939 |
| 2,282,092 | Roberts | May 5, 1942 |
| 2,354,148 | Shaw | July 18, 1944 |
| 2,443,935 | Shea | June 22, 1948 |